United States Patent
Yamazaki et al.

(10) Patent No.: US 8,142,679 B2
(45) Date of Patent: Mar. 27, 2012

(54) PIEZOELECTRIC CERAMIC COMPOSITION AND PIEZOELECTRIC ELEMENT MADE BY USING THE SAME

(75) Inventors: Masato Yamazaki, Komaki (JP); Takayuki Matsuoka, Nishikasugai-gun (JP); Katsuya Yamagiwa, Komaki (JP); Takeshi Mitsuoka, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 12/747,810

(22) PCT Filed: Jun. 22, 2009

(86) PCT No.: PCT/JP2009/002817
§ 371 (c)(1), (2), (4) Date: Jun. 11, 2010

(87) PCT Pub. No.: WO2010/001542
PCT Pub. Date: Jan. 7, 2010

(65) Prior Publication Data
US 2010/0264355 A1    Oct. 21, 2010

(30) Foreign Application Priority Data
Jun. 30, 2008 (JP) .................................. 2008-171618

(51) Int. Cl.
C04B 35/00 (2006.01)
C04B 35/495 (2006.01)
(52) U.S. Cl. .............................. 252/62.9 PZ; 252/62.9 R
(58) Field of Classification Search ........... 252/62.9 PZ, 252/62.9 R; 501/134; 423/598, 610; 310/358
See application file for complete search history.

(56) References Cited

U.S. PATENT DOCUMENTS 5,369,068 A * 11/1994 Kaneko ........................ 501/135
5,945,030 A * 8/1999 Kimura et al. ............ 252/62.9 R
7,009,328 B2 * 3/2006 Kitagawa et al. ............. 310/363
(Continued)

FOREIGN PATENT DOCUMENTS

JP          50-67492 A       6/1975
(Continued)

OTHER PUBLICATIONS

Seiji Ikegami et al., "Piezoelectricity in Ceramics of Ferroelectric Bismuth Compound with Layer Structure", Japanese Journal of Applied Physics, Oct. 1974, pp. 1572-1577, vol. 13, No. 10.

(Continued)

Primary Examiner — Jerry Lorengo
Assistant Examiner — Lynne Edmondson
(74) Attorney, Agent, or Firm — Sughrue Mion, PLLC

(57) ABSTRACT

The present invention provides a piezoelectric ceramic composition having a high thermal resistance and a high piezoelectric distortion constant and a piezoelectric element using the piezoelectric ceramic composition. The piezoelectric ceramic composition of the present invention contains Na, Bi, Ti, Cr and O, wherein the content ratio of Na, Bi, Ti and Cr in terms of oxides thereof falls within the following composition range: $aNa_2O-bBi_2O_3-cTiO_2-dCrO_{3/2}$ where a, b, c and d are mole fractions; $0.030 \leq a \leq 0.042$; $0.330 \leq b \leq 0.370$; $0.580 \leq c \leq 0.620$; $0 < d \leq 0.017$; and $a+b+c+d=1$. The piezoelectric ceramic composition preferably has a main crystal phase of bismuth layer-structured ferroelectric, more preferably $Na_{0.5}Bi_{4.5}Ti_4O_{15}$ crystal. The piezoelectric element of the present invention includes a piezoelectric body formed of the piezoelectric ceramic composition and at least a pair of electrodes held in contact with the piezoelectric body.

4 Claims, 2 Drawing Sheets

U.S. PATENT DOCUMENTS

| | | | |
|---|---|---|---|
| 2001/0015420 A1* | 8/2001 | Hirose et al. | 252/62.9 R |
| 2004/0245561 A1* | 12/2004 | Sakashita et al. | 257/310 |
| 2007/0090729 A1* | 4/2007 | Ohwada et al. | 310/358 |
| 2009/0289525 A1* | 11/2009 | Yamazaki et al. | 310/311 |

FOREIGN PATENT DOCUMENTS

| | | |
|---|---|---|
| JP | 11-029356 A | 2/1999 |
| JP | 2000327311 A * | 11/2000 |
| JP | 2006-169032 A | 6/2006 |
| JP | 2007-119269 A | 5/2007 |

OTHER PUBLICATIONS

Tadashi Takenaka et al., "Grain-Oriented and Mn-Doped $(NaBi)_{(1-x)/2}Ca_xBi_4Ti_4O_{15}$ Ceramics for Piezo- and Pyrosensor Materials", Sensors and Materials, 1988, pp. 035-046, vol. 1.

Standard of Electronic Materials Manufacturers Association of Japan, Electronic Test Methods for the Characterization of Piezoelectric Ceramic Oscillators EMAS-6100, 1993.

\* cited by examiner

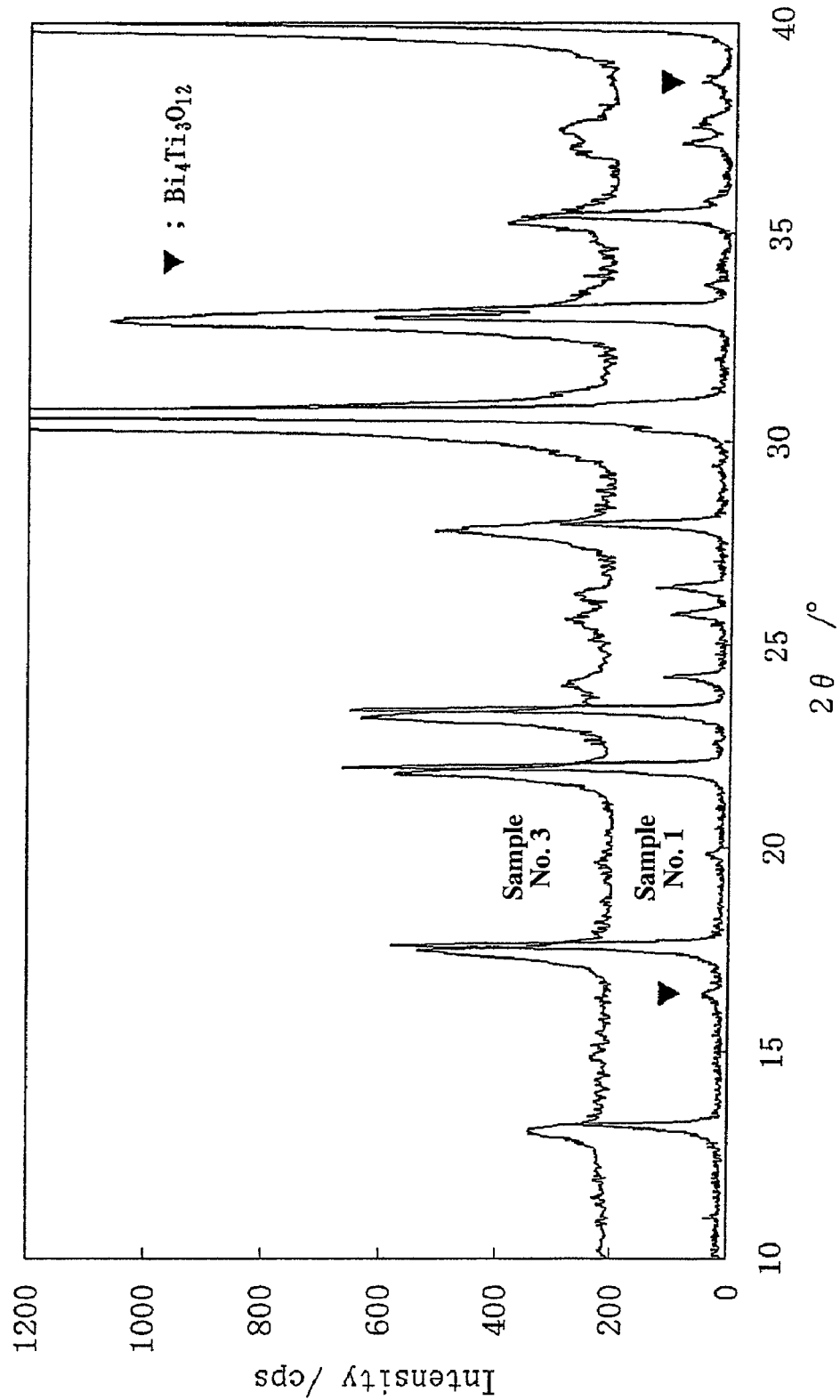
[FIG. 1]

[FIG. 2]
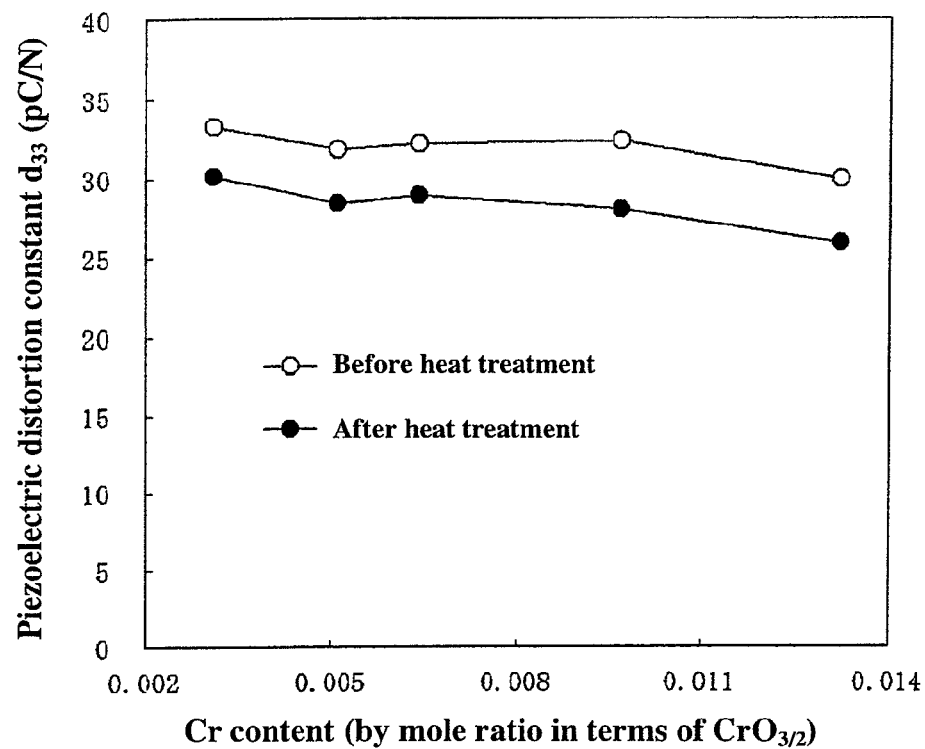
[FIG. 3]
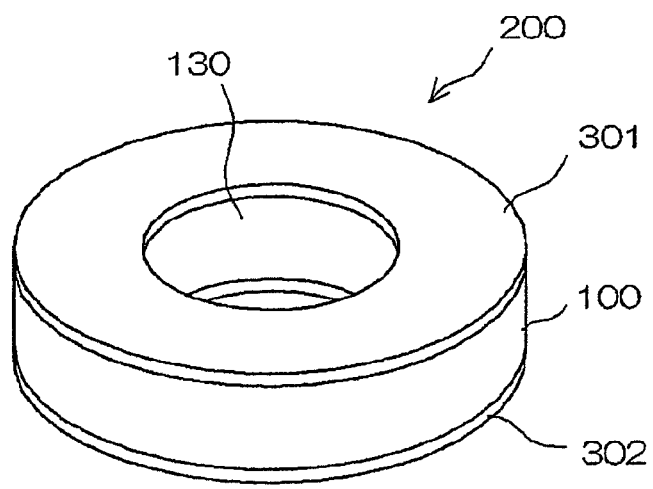

PIEZOELECTRIC CERAMIC COMPOSITION AND PIEZOELECTRIC ELEMENT MADE BY USING THE SAME

TECHNICAL FIELD

The present invention relates to a piezoelectric ceramic composition and a piezoelectric element using the piezoelectric ceramic composition and, more particularly, to a piezoelectric ceramic composition that contains Na, Bi and Ti but does not contain Pb and a piezoelectric element using the piezoelectric ceramic composition.

BACKGROUND ART

Piezoelectric ceramic materials currently in practical and widespread use are lead-containing piezoelectric ceramic materials typified by lead titanate (hereinafter simply referred to as "PT") and lead zirconate titanate (hereinafter simply referred to as "PZT"). The lead-containing piezoelectric ceramic materials contain lead (Pb) components and thus have the problem of environmental effects during productions and during and after uses. There is a demand for the urgent development of lead-free piezoelectric ceramic materials.

Further, the piezoelectric ceramic materials have Curie points and lose their piezoelectric properties in temperature ranges exceeding the Curie points. In general, the Curie points of the lead-containing piezoelectric ceramic materials are on the order of 200 to 500° C. There is a demand for piezoelectric ceramic materials usable at higher temperatures.

As a piezoelectric ceramic material that satisfies the above demands, a bismuth layer-structured ferroelectric "$Na_{0.5}Bi_{4.5}Ti_4O_{15}$ (hereinafter occasionally simply referred to as "NBT")" is known. The NBT has a high Curie point of about 670° C., which is higher than the Curie points of the PT and of the PZT, and is thus expected as a lead-free piezoelectric ceramic material usable in a high temperature range over 500° C. Each of Patent Documents 1 to 3 and Non-Patent Documents 1 and 2 discloses a piezoelectric ceramic composition containing the NBT as a main component.

Patent Document 1: Japanese Laid-Open Patent Publication No. 50-67492
Patent Document 2: Japanese Laid-Open Patent Publication No. 11-29356
Patent Document 3: Japanese Laid-Open Patent Publication No. 2007-119269
Non-Patent Document 1: "Piezoelectricity in Ceramics of Ferroelectric Bismuth Compound with Layer Structure", S. Ikegami and I. Ueda, Japanese Journal of Applied Physics, 13 (1974), p. 1572-1577
Non-Patent Document 2: "Grain-Oriented and Mn-Doped $(NaBi)_{(1-x)/2}Ca_xBi_4Ti_4O_{15}$ Ceramics for Piezo- and Pyrosensor Materials", T. Takenaka and K. Sakata, Sensor and Materials, 1 (1988), p. 35-46

DISCLOSURE OF THE INVENTION

Problems to be Solved by the Invention

The NBT does not contain a lead component and shows a high Curie point, but has the problem of a low piezoelectric distortion constant (d constant). Namely, the NBT produces a small amount of displacement relative to a voltage applied thereto so that it is difficult to use the NBT for sensors (e.g. pressure sensors).

It is known that the piezoelectric distortion constant of the crystal anisotropic material such as NBT can generally be improved by orientation treatment. However, the orientation treatment requires hot pressing and results in complication of production process and increase of production cost.

The present invention has been made in view of the above conventional technical problems. It is an object of the present invention to provide a piezoelectric ceramic composition having a high thermal resistance and a high piezoelectric distortion constant and to provide a piezoelectric element using the piezoelectric ceramic composition.

Means for Solving the Problems

The present invention has the following features.
[1] A piezoelectric ceramic composition containing Na, Bi, Ti, Cr and O, wherein the content ratio of Na, Bi, Ti and Cr in terms of oxides thereof falls within the following composition range (1):

$$aNa_2O\text{-}bBi_2O_3\text{-}cTiO_2\text{-}dCrO_{3/2} \qquad (1)$$

where a, b, c and d are mole fractions; $0.030 \leq a \leq 0.042$; $0.330 \leq b \leq 0.370$; $0.580 \leq c \leq 0.620$; $0 < d \leq 0.017$; and $a+b+c+d=1$.
[2] The piezoelectric ceramic composition according to the feature [1], wherein the piezoelectric ceramic composition is substantially free of an element of group 2 of the periodic table.
[3] The piezoelectric ceramic composition according to the feature [1] or [2], wherein the piezoelectric ceramic composition has a main crystal phase of bismuth layer-structured ferroelectric.
[4] The piezoelectric ceramic composition according to the feature [3], wherein the main crystal phase of the piezoelectric ceramic composition is of $Na_{0.5}Bi_{4.5}Ti_4O_{15}$ crystal.
[5] The piezoelectric ceramic composition according to any one of the features [1] to [4], wherein the content of Cr in terms of $CrO_{3/2}$ is 1.00 mass % or less based on 100 mass % of the entire piezoelectric ceramic composition.
[6] The piezoelectric ceramic composition according to any one of the features [1] to [4], wherein the content of Cr in terms of $CrO_{3/2}$ is 0.35 mass % or less based on 100 mass % of the entire piezoelectric ceramic composition.
[7] A piezoelectric element, comprising: a piezoelectric body formed of the piezoelectric ceramic composition according to any one of the features [1] to [6]; and at least a pair of electrodes held in contact with the piezoelectric body.

Effects of the Invention

The piezoelectric ceramic composition of the present invention does not contain a lead component and shows not only a high Curie point and a high thermal resistance but also a high piezoelectric distortion constant. The piezoelectric ceramic composition of the present invention can attain these piezoelectric properties even in a non-oriented state (where crystal grains have substantially no orientation).

The Curie point of the piezoelectric ceramic composition can be increased assuredly, without a decrease in the Curie point, by the effect of the Na—Bi—Ti—Cr—O composition system when the piezoelectric ceramic composition is substantially free of an element of group 2 of the periodic table. The piezoelectric ceramic composition, when substantially free of the element of group 2, can also attain the merit that the amount of deterioration of the piezoelectric distortion constant (d33) of the piezoelectric ceramic composition can be limited to within the range that would not cause any problem in practical use even during high heat exposure. It is herein noted that, in the present invention, the element of group 2 is undetectable by X-ray fluorescence analysis (XRF) when the piezoelectric ceramic composition is substantially free of the element of group 2.

When the piezoelectric ceramic composition has a main crystal phase of bismuth layer-structured ferroelectric, the thermal resistance and piezoelectric distortion constant of the piezoelectric ceramic composition can be improved to particularly high levels. The thermal resistance and piezoelectric distortion constant of the piezoelectric ceramic composition can be further improved to higher levels when the main crystal phase of the piezoelectric ceramic composition is of $Na_{0.5}Bi_{4.5}Ti_4O_{15}$ crystal.

Furthermore, the thermal resistance and piezoelectric distortion constant of the piezoelectric ceramic composition can be improved to particularly high levels when the content of Cr in terms of $CrO_{3/2}$ is 1.00 mass % or less (more preferably, 0.35 mass % or less) based on 100 mass % of the entire piezoelectric ceramic composition.

The piezoelectric element of the present invention does not contain a lead component and shows not only a high thermal resistance with a high Curie point but also excellent piezoelectric properties such as a high piezoelectric distortion constant.

BEST MODES FOR CARRYING OUT THE INVENTION

[1] Piezoelectric Ceramic Composition

The piezoelectric ceramic composition of the present invention contains Na, Bi, Ti, Cr and O in such a manner that the content ratio of the Na, Bi, Ti and Cr in terms of oxides thereof falls within the following composition range (1):

$$aNa_2O\text{-}bBi_2O_3\text{-}cTiO_2\text{-}dCrO \quad (1)$$

where a, b, c and d are mole fractions; $0.030 \leq a \leq 0.042$; $0.330 \leq b \leq 0.370$; $0.580 \leq c \leq 0.620$; $0 < d \leq 0.017$; and $a+b+c+d=1$.

In other words, the piezoelectric ceramic composition of the present invention contains Na, Bi, Ti, Cr and O in such a manner that, when the composition ratio of the metal elements Na, Bi, Ti and Cr is represented by the following formula (2) in terms of the metal oxides $Na_2O$, $Bi_2O_3$, $TiO_2$ and $CrO_{3/2}$, the mole fractions a, b, c and d of the oxides simultaneously satisfy the following formulas (3) to (7).

$$aNa_2O\text{-}bBi_2O_3\text{-}cTiO_2\text{-}dCrO_{3/2} \quad (2)$$

$$0.030 \leq a \leq 0.042 \quad (3)$$

$$0.330 \leq b \leq 0.370 \quad (4)$$

$$0.580 \leq c \leq 0.620 \quad (5)$$

$$0 < d \leq 0.017 \quad (6)$$

$$a+b+c+d=1 \quad (7)$$

The mole fraction "a" represents a ratio of the mole content of Na in terms of $Na_2O$ to the total mole content of Na, Bi, Ti and Cr in terms of $Na_2O$, $Bi_2O_3$, $TiO_2$ and $CrO_{3/2}$ (molar ratio, a/(a+b+c+d)) and falls within the ranges of $0.030 \leq a \leq 0.042$. The piezoelectric ceramic composition favorably has a higher piezoelectric distortion constant when the mole fraction a falls within the above range.

The mole fraction "b" represents a ratio of the mole content of Bi in terms of $Bi_2O_3$ to the total mole content of Na, Bi, Ti and Cr in terms of $Na_2O$, $Bi_2O_3$, $TiO_2$ and $CrO_{3/2}$ (mole number ratio, b/(a+b+c+d)) and falls within the ranges of $0.330 \leq b \leq 0.370$. The piezoelectric ceramic composition favorably has a higher piezoelectric distortion constant when the mole fraction b falls within the above range.

The mole fraction "c" represents a ratio of the mole content of Ti in terms of $TiO_2$ to the total mole content of Na, Bi, Ti and Cr in terms of $Na_2O$, $Bi_2O_3$, $TiO_2$ and $CrO_{3/2}$ (molar ratio, c/(a+b+c+d)) and falls within the ranges of $0.580 \leq c \leq 0.620$. The piezoelectric ceramic composition favorably has a higher piezoelectric distortion constant when the mole fraction c falls within the above range.

The mole fraction "d" represents a ratio of the mole content of Cr in terms of $CrO_{3/2}$ to the total mole content of Na, Bi, Ti and Cr in terms of $Na_2O$, $Bi_2O_3$, $TiO_2$ and $CrO_{3/2}$ (molar ratio, d/(a+b+c+d)) and falls within the ranges of $0<d\leq 0.017$. The piezoelectric ceramic composition shows a particularly higher piezoelectric distortion constant and attains excellent piezoelectric properties when the mole fraction d falls within the above range. The piezoelectric ceramic composition tends to show a low piezoelectric distortion constant when d>0.017. The reason for this is assumed that the crystal structure of the piezoelectric ceramic composition becomes unstable due to an excessively large crystal distortion in bismuth layer-structured ferroelectric. Thus, the molar fraction d preferably falls within the range of $0<d\leq 0.017$, more preferably $0<d\leq 0.010$.

It is preferable that the piezoelectric ceramic composition of the present invention has a main crystal phase of bismuth layer-structured ferroelectric. In the present invention, the bismuth layer-structured ferroelectric refers to a compound having a crystal structure in which layers of $[(Bi_2O_2)^{2+}]$ and $[(X_{m-1}Ti_mO_{3m+1})^{2-}]$ are alternately laminated together. In the above formula, X represents Na and Bi and m represents an integer of 1 to 8. It is particularly preferable that the bismuth layer-structured ferroelectric ceramic composition is of $Na_{0.5}Bi_{4.5}Ti_4O_{15}$ crystal. This makes it possible that the piezoelectric ceramic composition can attain a particularly high thermal resistance as well as a particularly high piezoelectric distortion constant.

It means that, when the main crystal phase of the piezoelectric ceramic composition is of bismuth layer-structured ferroelectric, the bismuth layer-structured ferroelectric is identified as a main component of the piezoelectric ceramic composition in an X-ray diffraction chart as measured by X-ray diffraction in the same manner as in the after-mentioned examples. It is particularly preferable that the piezoelectric ceramic composition consists substantially of only such a crystal phase.

It is further preferable that the content of Cr in terms of $CrO_{3/2}$ is more than 0 mass % and is 1.00 mass % or less based on 100 mass % of the entire piezoelectric ceramic composition. In other words, the piezoelectric ceramic composition preferably satisfies the condition of $0<MCr\leq 1.00$ where MCr represents the Cr content (mass %) in terms of $CrO_{3/2}$. In the above content range, the piezoelectric ceramic composition shows a particularly high piezoelectric distortion constant and attains excellent piezoelectric properties. The piezoelectric ceramic composition tends to show a low piezoelectric distortion constant when MCr>1.00. The reason for this is assumed that the crystal structure of the piezoelectric ceramic composition becomes unstable due to an excessively large crystal distortion in bismuth layer-structured ferroelectric. It is more preferable that the Cr content in terms of $CrO_{3/2}$ falls within the range of $0<MCr\leq 0.70$, still more preferably $0<MCr\leq 0.35$.

The bismuth layer-structured ferroelectric can be formed with particularly high efficiency by the addition of Cr into the Na—Bi—Ti—O piezoelectric composition system. The additive element Cr is assumed to be particularly effective in promoting the formation of a crystal of bismuth layer-structured ferroelectric, notably $Na_{0.5}Bi_{4.5}Ti_4O_{15}$ (NBT), and in limiting the growth of an impurity phase or phases during the crystal formation. Examples of the impurity phase or phases are those of $Bi_4Ti_3O_{12}$ crystal and $Bi_{0.5}Na_{0.5}TiO_3$ crystal. It is, namely, assumed that the growth of such an impurity phase or phases can be limited effectively by the addition of Cr so as to form the bismuth layer-structured ferroelectric crystal with very high yield and thereby provide the piezoelectric ceramic composition with excellent piezoelectric properties.

In addition, it is also assumed that the addition of Cr into the Na—Bi—Ti—O piezoelectric composition system allows, during the formation of the bismuth layer-structured ferroelectric NBT, a distortion in the NBT crystal structure so as to increase the piezoelectric distortion constant.

The piezoelectric ceramic composition of the present invention, even when in the form of a polycrystal with no orientation of crystal grains, can exhibit the above-mentioned high heat resistance and high piezoelectric distortion constant.

In order for the piezoelectric ceramic composition to maintain a piezoelectric distortion constant (d33) of 20 pC/N or higher even after heat treatment at 600° C. for 1 hour, it is preferable to satisfy the conditions of $0.030 \leq a \leq 0.042$, $0.030 \leq b \leq 0.370$, $0.580 \leq c \leq 0.620$, $0 \leq d \leq 0.017$ and $0 < MCr \leq 0.70$.

There is no particular restriction on the production process of the piezoelectric ceramic composition in the present invention. The piezoelectric ceramic composition can be produced by mixing raw powder materials (oxide, carbonate, hydrogencarbonate, nitrate powders etc.) of the respective constituent metal elements in such a manner that the resulting composition satisfies the above composition range (1), calcinating the raw powder mixture at a temperature lower than a sintering temperature, and then, sintering the raw powder mixture at a temperature (maximum temperature) higher than or equal to 1000° C.

One more specific example of the piezoelectric ceramic composition production process is as follows. First, a sodium carbonate powder, a bismuth oxide powder, a titanium oxide powder and a chromium oxide powder are prepared as raw materials for the constituent metal elements Na, Bi, Ti and Cr. These raw powder materials are weighed out in such a manner that the resulting composition satisfies the above composition range (1), and subjected to wet mixing with a dispersion medium (e.g. ethanol) by a mixer (e.g ball mill). The thus-obtained slurry is dried to yield a raw powder mixture. Herein, each of the raw material powders used contains a very small amount of group 2 element or does not contain any group 2 element at all.

The raw powder mixture is then calcinated (e.g. in the air at 600° C. to 1100° C. for 10 minutes to 300 minutes). The calcinated powder mixture is blended with a binder (e.g. polyvinyl alcohol, polyvinyl butyral etc.) and a dispersion medium (e.g. alcohol, ether etc.) and subjected to wet pulverization by a mixer (e.g. ball mill). The thus-obtained slurry is dried and granulated to yield a granulated powder material.

The granulated powder material is molded into a body of desired shape. There is no particular restriction on the molding conditions. The molding is preferably conducted by e.g. uniaxial molding at about 30 MPa, followed by cold isostatical press (CIP) at about 150 MPa. After that, the molded body is sintered. With this, the piezoelectric ceramic composition of the present invention is produced in the form of the sintered body.

[2] Piezoelectric Element

The piezoelectric element of the present invention has a piezoelectric body formed of the piezoelectric ceramic composition of the present invention and at least a pair of electrodes held in contact with the piezoelectric body.

The piezoelectric body refers to a piezoelectric ceramic product formed from the piezoelectric ceramic composition of the present invention so as to function as substantial part that exerts the piezoelectric properties of the piezoelectric element. There is no particular restriction on the shape and size of the piezoelectric body. The shape and size of the piezoelectric body can be selected as appropriate depending on the use of the piezoelectric element for the purpose of pressure measurement, oscillation and the like. In the use for pressure measurement purpose, the piezoelectric body can be formed into various shapes such as a plate shape having a rectangular plan configuration, a circular plan configuration etc., a plate shape having a center through hole made in a thickness direction thereof, a prism shape and a cylindrical shape. The piezoelectric element of the present invention may have a plurality of piezoelectric bodies of the above shape laminated together.

The pair of electrodes refer to conductor layers formed on and held in contact with a surface of the piezoelectric body. These electrodes may be formed on different surfaces of the piezoelectric body or may be formed on one same surface of the piezoelectric body. There is no particular restriction on the shape, size and material of the electrodes. The shape, size and material of the electrodes can be selected as appropriate depending on the size of the piezoelectric body and the use of the piezoelectric element etc. For example, the electrodes can have a flat shape. In the case of forming the electrodes on the same surface of the piezoelectric body, the electrodes may have a comb teeth shape or a semicircular shape. There is also no particular restriction on the formation process of the electrodes. In general, each of the electrodes can be formed by applying a conductive paste to any desired surface of the piezoelectric body and baking the conductive paste.

As one example of the piezoelectric element, a piezoelectric element 200 is shown in FIG. 3. The piezoelectric element 200 has a circular plate shape with a center through hole 130 and includes a piezoelectric body 100 formed of the piezoelectric ceramic composition of the present invention and conductor layers 301 and 302 (as a pair of electrodes) formed on opposite main surfaces of the piezoelectric body 100.

The conductor layers can be formed by e.g., after parallel polishing the surface of the sintered body of the piezoelectric ceramic composition of the present invention, applying a conductive paste to the polished surface of the sintered piezoelectric body and baking the conductive paste (e.g. at 600 to 800° C. for 10 minutes). The conductive paste is generally prepared from a glass fit, a conductive component and an organic medium. The glass frit is herein used to improve the strength of joint between the piezoelectric body and the electrodes.

Examples of the conductive component are powders of noble metals such as silver, gold, palladium and platinum and mixtures of two or more thereof. There can also be used powders of metals such as copper and nickel and alloys thereof and mixtures thereof as the conductive component.

The piezoelectric element of the present invention may be subjected to polarization treatment so as to secure the above-mentioned piezoelectric properties. The polarization treatment can be conducted by placing the piezoelectric element in an insulating atmosphere of controlled temperature (e.g. in a high insulation liquid such as a silicon oil or Fluorinert liquid at 25 to 250° C.), and then, applying an electric field of 1 to 10 kV/mm between the electrodes for 1 to 60 minutes.

EXAMPLES

The present invention will be described in more detail below by way of the following examples.

Experiment 1

Raw powders of sodium carbonate ($Na_2CO_3$, purity: 99.53%), bismuth oxide ($Bi_2O_3$, purity: 98.8%), titanium oxide ($TiO_2$, purity: 99.0%) and chromium oxide ($Cr_2O_3$, purity: 99.8%) were weighed out to have mole fractions indicated in TABLE 1 (Examples: Sample Nos. 2 to 6, Comparative Examples: Sample Nos. 1 and 7) and subjected to wet mixing with ethanol for 15 hours by a ball mill. The thus-obtained slurry was dried in a hot water bath, thereby yielding a raw powder mixture. The raw powder mixture was calcinated at 800° C. for 120 minutes, blended with an organic binder and ethanol, and subjected to wet mixing for 15 hours by a ball mill. The thus-obtained slurry was dried and granulated to yield a granulated powder material. Herein, no element of group 2 was detected or identified by ICP emission analysis in each of the raw powders.

The granulated powder material was molded into a disc shape with a diameter of 20 mm and a thickness of 3 mm by uniaxial molding at 30 MPa. The molded body was subjected to cold isostatical press (CIP) at 150 MPa and sintered at 1150° C. for 120 minutes. With this, the sintered body of each of Sample Nos. 1 to 7 was completed.

TABLE 1

| | Piezoelectric Ceramic Compositions | | | | | |
|---|---|---|---|---|---|---|
| | a | b | c | d | — | |
| | $Na_2O$ | $Bi_2O_3$ | $TiO_2$ | $CrO_{3/2}$ | CoO | $CrO_{3/2}$ |
| Sample | mole | mole | mole | mole | mole | content |
| No. | fraction | fraction | fraction | fraction | fraction | (mass %) |
| *1 | 0.0385 | 0.3462 | 0.6154 | *0.0000 | 0.0000 | *0.00 |
| 2 | 0.0369 | 0.3456 | 0.6144 | 0.0031 | 0.0000 | 0.11 |
| 3 | 0.0368 | 0.3449 | 0.6132 | 0.0051 | 0.0000 | 0.18 |
| 4 | 0.0367 | 0.3445 | 0.6124 | 0.0064 | 0.0000 | 0.23 |
| 5 | 0.0366 | 0.3433 | 0.6103 | 0.0097 | 0.0000 | 0.35 |
| 6 | 0.0365 | 0.3421 | 0.6082 | 0.0132 | 0.0000 | 0.48 |
| *7 | 0.0368 | 0.3450 | 0.6031 | *0.0000 | 0.0051 | *0.00 |

Both of opposite main surfaces of each sintered body was polished. A pair of electrodes were formed on the respective main surfaces of the sintered body by applying a silver paste of a glass frit (containing $SiO_2$, $Al_2O_3$, ZnO and $TiO_2$), a silver powder and butylcarbitol acetate to the main surfaces of the sintered body and baking the conductive paste at 700° C. for 20 minutes. The resulting piezoelectric element, in which the electrodes had been formed on the main surfaces of the sintered body, was polarized with the application of an electric field of 9 kV/mm for 30 minutes in an insulating oil at 150° C.

The piezoelectric distortion constant (d33) of the respective piezoelectric elements was measured before and after heat treatment at 600° C. for 1 hour. The measurements of the piezoelectric distortion constant (d33) were conducted according to EMAS-6100 with the use of an impedance analyzer (available as Model "4194A" from Hewlett-Packard Co.) under conditions that the piezoelectric element was placed still in a constant temperature bath of 20° C. The measurement results are indicated in TABLE 2. The correlations between the Cr content and the piezoelectric distortion constant of the piezoelectric elements before and after the heat treatment are indicated in graph form in FIG. 2.

Further, the $\epsilon_{33}T/\epsilon_0$ (relative dielectric constant), Qm value (mechanical quality factor, obtained from a capacitance at 1 kHz) and kt value (electromechanical coupling factor) of the respective piezoelectric elements were also measured. The measurements of these values were conducted according to "Standard of Electronic Materials Manufacturers Association of Japan, Electronic Test Methods for the Characterization of Piezoelectric Ceramic Oscillators EMAS-6100".

For confirmation of the composition range and crystal phase of the piezoelectric ceramic compositions in the respective piezoelectric elements, the same sintered bodies of the piezoelectric ceramic compositions as above were subjected to composition analysis by X-ray fluorescence spectroscopy as well as crystal phase identification by X-ray diffraction. The X-ray fluorescence spectroscopic composition analysis was conducted using a X-ray fluorescence spectrometer (Model "ZSX100e" available from Rigaku Co.). The X-ray diffraction observation was conducted using a X-ray diffractometer (Model "RU-200T" available from Rigaku Co.). The analysis and identification results are indicated in TABLE 2. The X-ray diffraction charts of Sample Nos. 1 and 3 are indicated in FIG. 1.

TABLE 2

| | Properties of Piezoelectric Ceramic Compositions | | | | | |
|---|---|---|---|---|---|---|
| | | | | Before heat | After heat | |
| Sample | $\epsilon_{33}{}^T/$ | | kt | treatment | treatment | Crystal phase |
| No. | $\epsilon_0$ | Qm | (%) | $d_{33}$ (pC/N) | $d_{33}$ (pC/N) | Main | Other |
| *1 | 150 | 1300 | 10.0 | 12.9 | — | NBT | BiT |
| 2 | 111 | 4600 | 35.1 | 33.3 | 30.2 | NBT | none |
| 3 | 122 | 4800 | 34.2 | 31.9 | 28.5 | NBT | none |
| 4 | 110 | 4400 | 27.8 | 32.2 | 29.0 | NBT | none |
| 5 | 110 | 3600 | 34.6 | 32.4 | 28.1 | NBT | none |
| 6 | 111 | 2800 | 29.7 | 30.0 | 26.0 | NBT | none |
| *7 | 150 | 1500 | 27.0 | 30.0 | — | NBT | — |

Crystal phase: NBT ... $Na_{0.5}Bi_{4.5}Ti_4O_{15}$, BiT ... $Bi_4Ti_3O_{12}$

As is seen from the results of TABLES 1 and 2, the Cr-free piezoelectric element of Sample No. 1 had a low d33 value of 12.9 pC/N, a small Qm value of 1300 and a small kt value of 10.0%. (The piezoelectric element of Sample 1 was not heat treated because of its low d33 value before the heat treatment.) Further, the piezoelectric ceramic composition of Sample No. 1 had a secondary crystal phase as is seen from the X-ray diffraction measurement result. The piezoelectric element of Sample No. 7 in which Co was used in place of Cr had a high d33 value of 30 pC/N and a good kt value of 27.0% but a small Qm value of 1500.

On the other hand, the piezoelectric elements of Sample Nos. 2 to 6, which correspond to Examples of the present invention, had a very high d33 value of 30 to 33.3 pC/N, a very good kt value of 27.8 to 35.1% and a very good Qm value of 2800 to 4800. As is seen from the X-ray diffraction measurement results, each of the piezoelectric ceramic compositions of Sample Nos. 2 to 6 had a crystal phase of bismuth layer-structured ferroelectric $Na_{0.5}Bi_{4.5}Ti_4O_{15}$ with no secondary crystal phase.

In particular, the piezoelectric elements of Sample Nos. 2 to 3 and 5 to 6 had a very high d33 value of 26.0 to 30.2 pC/N after the heat treatment at such a high temperature of 600° C. The rate of maintenance of the d33 value was favorably 86.7 to 90.7%. It is evident that these piezoelectric elements could exhibit a high thermal resistance even at 600° C.

Further, the piezoelectric ceramic compositions of Sample Nos. 2 to 6 were confirmed to have no crystal orientation. It is evident that these piezoelectric ceramic compositions could exert the above excellent properties sufficiently even in such a non-oriented state.

Experiment 2

The piezoelectric ceramic composition (piezoelectric element) of Sample No. 2 of Experiment 1 and piezoelectric ceramic compositions (piezoelectric elements) (Comparative Examples) produced by the addition of group 2 elements of Ba and Sr to the piezoelectric electric composition of Sample No. 2 were tested for the Curie point (Tc), the initial piezoelectric distortion constant (d33) (before heat treatment) and the piezoelectric distortion constant (d33) after heat treatment at 600° C. for 1 hour.

Herein, the raw powders for the piezoelectric ceramic composition of Sample No. 2 were the same as those used in Experiment 1. For the piezoelectric ceramic compositions of Sample Nos. 8 and 9, the raw materials were prepared based on those for the piezoelectric ceramic composition of Sample No. 2 by, when expressing the main component of NBT as $(Na_{0.5}Bi_{0.5})Bi_4Ti_4O_{15}$, replacing $(Na_{0.5}Bi_{0.5})$ with 25 mol % Ba and 25 mol % Sr, respectively.

Using these raw powders, the piezoelectric ceramic compositions were produced in the same manner as in Experiment 1. The piezoelectric elements were obtained from the respective piezoelectric ceramic compositions.

The Curie point (Curie temperature) Tc of the respective piezoelectric elements (samples) were measured with the use of an impedance analyzer (available as Model "4194A" from Hewlett-Packard Co) and an electric furnace. The initial piezoelectric distortion constant (d33) of the piezoelectric element (before heat treatment) and the piezoelectric distortion constant (d33) of the piezoelectric element after heat treatment at 600° C. for 1 hour were measured in the same manner as in Experiment 1. The measurement results are indicated in TABLE 3. Further, X-ray fluorescence analysis was performed on the sintered bodies of the piezoelectric elements of Sample Nos. 8 and 9. Ba and Sr components were detected in the sintered bodies of the piezoelectric elements of Sample Nos. 8 and 9.

TABLE 3

| | | | Properties of Piezoelectric Ceramic Compositions | |
|---|---|---|---|---|
| Sample No. | Group 2 element | Tc (° C.) | Before heat treatment $d_{33}$ (pC/N) | After heat treatment $d_{33}$ (pC/N) |
| 2 | none | 690 | 33.3 | 30.2 |
| *8 | Ba | 580 | 17.5 | 0 |
| *9 | Sr | 570 | 22.3 | 0 |

The piezoelectric ceramic compositions of Sample Nos. 8 and 9 (Comparative Examples) containing the group 2 elements Ba and Sr, respectively, had a low Curie point Tc of lower than 600° C. as shown in TABLE 3. Although the piezoelectric distortion constant (d33) of the piezoelectric ceramic composition (piezoelectric element) of Sample No. 2 was slightly deteriorated by the heat treatment, the amount of deterioration of the piezoelectric distortion constant (d33) before and after the heat treatment was within the range that would not cause any problem in practical use. On the other hand, the piezoelectric distortion constant (d33) of the piezoelectric ceramic compositions (piezoelectric elements) of Sample Nos. 8 and 9 was significantly deteriorated by the heat treatment.

It is evident from the above results that the piezoelectric ceramic composition of the present invention containing Na, Bi, Ti, Cr and O in the above composition range (1) could avoid a decrease in the Curie point and limit the amount of deterioration of the piezoelectric distortion constant (d33) to such a degree as not to cause any problem in practical use by making the piezoelectric ceramic composition substantially free of the group 2 element.

The present invention is not limited to the above embodiments. Various modifications and variations of the embodiments described above will occur to those skilled in the art within the scope of the present invention.

INDUSTRIAL APPLICABILITY

The piezoelectric ceramic composition and piezoelectric element of the present invention have a wide range of uses for pressure measurement purpose, vibration measurement purpose and piezoelectric device purpose. More specifically, the piezoelectric ceramic composition and piezoelectric element of the present invention are suitable for use in piezoelectric transformers, resonators, combustion pressure sensors, knocking sensors, pressure sensors, ultrasonic sensors, load sensors, ultrasonic motors, piezoelectric gyro sensors, piezoelectric vibrators and actuators etc. Among others, the piezoelectric ceramic composition and piezoelectric element of the present invention can particularly suitably be used in piezoelectric transformers and resonators for good mechanical quality factor and good resonance-frequency temperature dependence and used in high-temperature sensors such as combustion pressure sensors for long term stability as well as high sensitivity even under high temperature conditions of e.g. the vicinity of vehicle combustion chambers.

BRIEF DESCRIPTION OF DRAWINGS

FIG. 1 is a multiple chart showing the results of X-ray diffraction measurements of piezoelectric ceramic compositions of Sample Nos. 1 and 3.

FIG. 2 is a graph showing a correlation between the Cr content and piezoelectric distortion constant (d33) of piezoelectric ceramic composition.

FIG. 3 is a perspective view showing one example of piezoelectric element according to the present invention.

EXPLANATION OF REFERENCE NUMERALS

100: Pizoelectric body formed of pizoelectric ceramic composition
130: Through hole
200: Piezoelectric element
301, 302: Conductor layers (A pair of electrodes)

The invention claimed is:

1. A piezoelectric ceramic composition containing Na, Bi, Ti, Cr and O,
wherein the content ratio of said Na, Bi, Ti and Cr in terms of oxides thereof falls within the following composition range (1):

$$aNa_2O\text{-}bBi_2O_3\text{-}cTiO_2\text{-}dCrO_{3/2} \tag{1}$$

where a, b, c and d are mole fractions; $0.030 \leq a \leq 0.042$; $0.330 \leq b \leq 0.370$; $0.580 \leq c \leq 0.620$; $0 < d \leq 0.017$; and $a+b+c+d=1$; and wherein the piezoelectric ceramic composition is substantially free of an element of group 2 of the periodic table, the piezoelectric ceramic composition has a main crystal phase of bismuth layer-structured ferroelectric, and the main crystal phase of the piezoelectric ceramic composition is of $Na_{0.5}Bi_{4.5}Ti_4O_{15}$ crystal.

2. The piezoelectric ceramic composition according to claim 1, wherein the content of said Cr in terms of $CrO_{3/2}$ is 1.00 mass % or less based on 100 mass % of the entire piezoelectric ceramic composition.

3. The piezoelectric ceramic composition according to claim 1, wherein the content of said Cr in terms of $CrO_{3/2}$ is 0.35 mass % or less based on 100 mass % of the entire piezoelectric ceramic composition.

4. A piezoelectric element, comprising:

a piezoelectric body formed of the piezoelectric ceramic composition according to claim 1; and at least a pair of electrodes held in contact with the piezoelectric body.

* * * * *